(12) United States Patent
Hassan et al.

(10) Patent No.: US 9,121,100 B2
(45) Date of Patent: Sep. 1, 2015

(54) SILVER BASED CONDUCTIVE LAYER FOR FLEXIBLE ELECTRONICS

(71) Applicant: Intermolecular Inc., San Jose, CA (US)

(72) Inventors: Mohd Fadzli Anwar Hassan, San Francisco, CA (US); Guowen Ding, San Jose, CA (US); Minh Huu Le, San Jose, CA (US); Minh Anh Anh Nguyen, San Jose, CA (US); Zhi-Wen Wen Sun, Sunnyvale, CA (US); Guizhen Zhang, Santa Clara, CA (US)

(73) Assignee: Intermolecular, Inc., San Jose, CA (US)

( * ) Notice: Subject to any disclaimer, the term of this patent is extended or adjusted under 35 U.S.C. 154(b) by 110 days.

(21) Appl. No.: 13/715,477

(22) Filed: Dec. 14, 2012

(65) Prior Publication Data
US 2014/0170413 A1    Jun. 19, 2014

(51) Int. Cl.
| | |
|---|---|
| C23C 28/00 | (2006.01) |
| C23C 30/00 | (2006.01) |
| H01L 51/52 | (2006.01) |
| H01L 51/00 | (2006.01) |

(52) U.S. Cl.
CPC ............ C23C 28/42 (2013.01); C23C 30/00 (2013.01); H01L 51/5234 (2013.01); H01L 51/0097 (2013.01); Y10T 428/265 (2015.01)

(58) Field of Classification Search
None
See application file for complete search history.

(56) References Cited

U.S. PATENT DOCUMENTS

| | | | |
|---|---|---|---|
| 7,771,571 B2 | 8/2010 | Laird et al. | |
| 2006/0255727 A1* | 11/2006 | Nee | 313/506 |
| 2007/0020138 A1* | 1/2007 | Obata et al. | 420/501 |
| 2007/0026232 A9 | 2/2007 | Sasaki | |

FOREIGN PATENT DOCUMENTS

| | | |
|---|---|---|
| EP | 0751099 A | 1/1997 |
| WO | WO-2004-042108A2 A | 5/2004 |
| WO | WO 2004042108 A2 * | 5/2004 |

OTHER PUBLICATIONS

Kato, K., et al.; Visible and Near Infrared Light Absorbance of Ag Thin Films Deposited on ZnO Under Layers by Magnetron Sputtering; Jan. 1, 2011; Central Glass Co. Ltd.; Solar Energy Materials and Solar Cells 5 pages.

Ando, E., et al; Durability of Doped Zince OxideSilverDoped Zinc Oxide Low Emissivity Coatings in Humid Environment; Jun. 14, 2007; Asahi Glass; Thin Solid Films pp. 45744577.

Park, Y., et al.; Flexible Indium Zinc OxideAgIndium Zinc Oxide Multilayer Electrode Grown on Polythersulfone Substrate by CostEfficient RollToRoll Sputtering for Flexible Organic Photovoltaics; Nov. 16, 2009; American Vacuum Society; J. Vac. Sci. Technol. Jan. Feb. 2010 pp. 4147.

* cited by examiner

*Primary Examiner* — Timothy Meeks
*Assistant Examiner* — Michael P Rodriguez

(57) ABSTRACT

Methods for making conducting stacks includes forming a doped or alloyed silver layer sandwiched between two layers of transparent conductive oxide such as indium tin oxide (ITO). The doped silver or silver alloy layer can be thin, such as between 1.5 to 20 nm and thus can be transparent. The doped silver or silver alloy can provide improved ductility property, allowing the conductive stack to be bendable. The transparent conductive oxide layers can also be thin, allowing the conductive stack to have an improved ductility property.

11 Claims, 11 Drawing Sheets

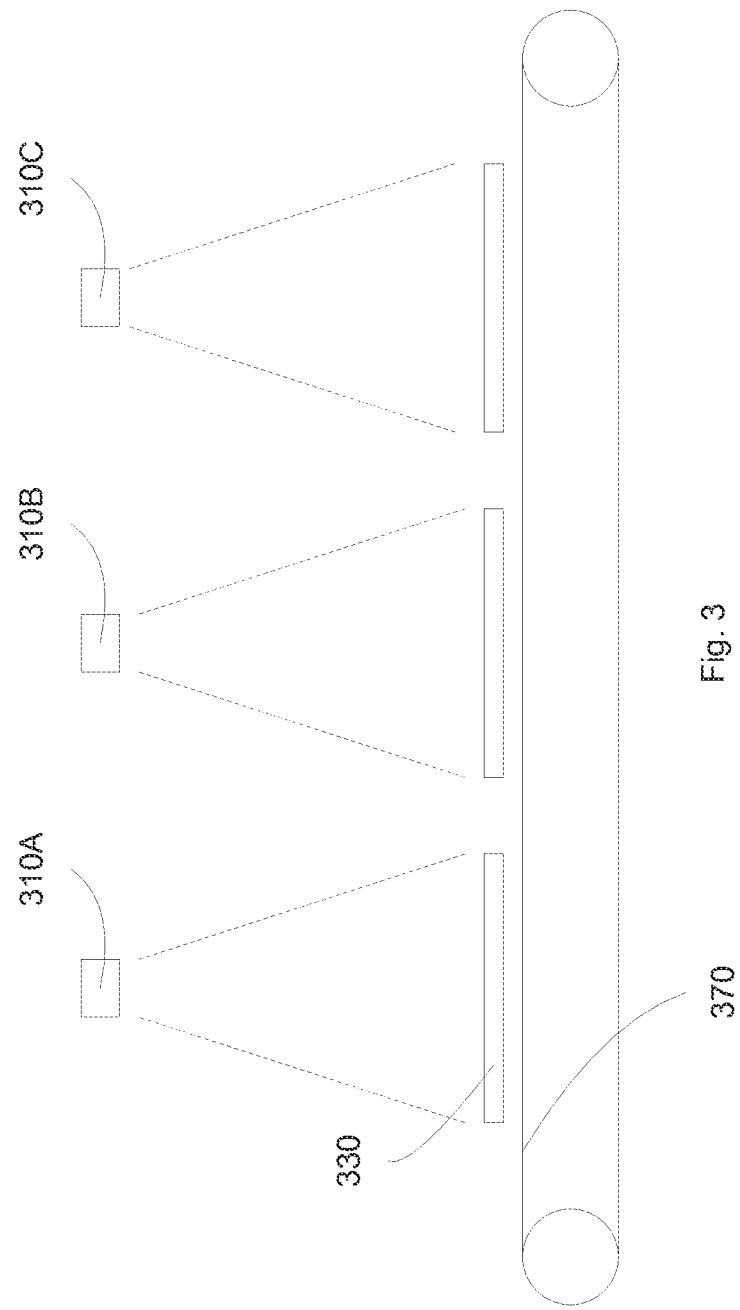

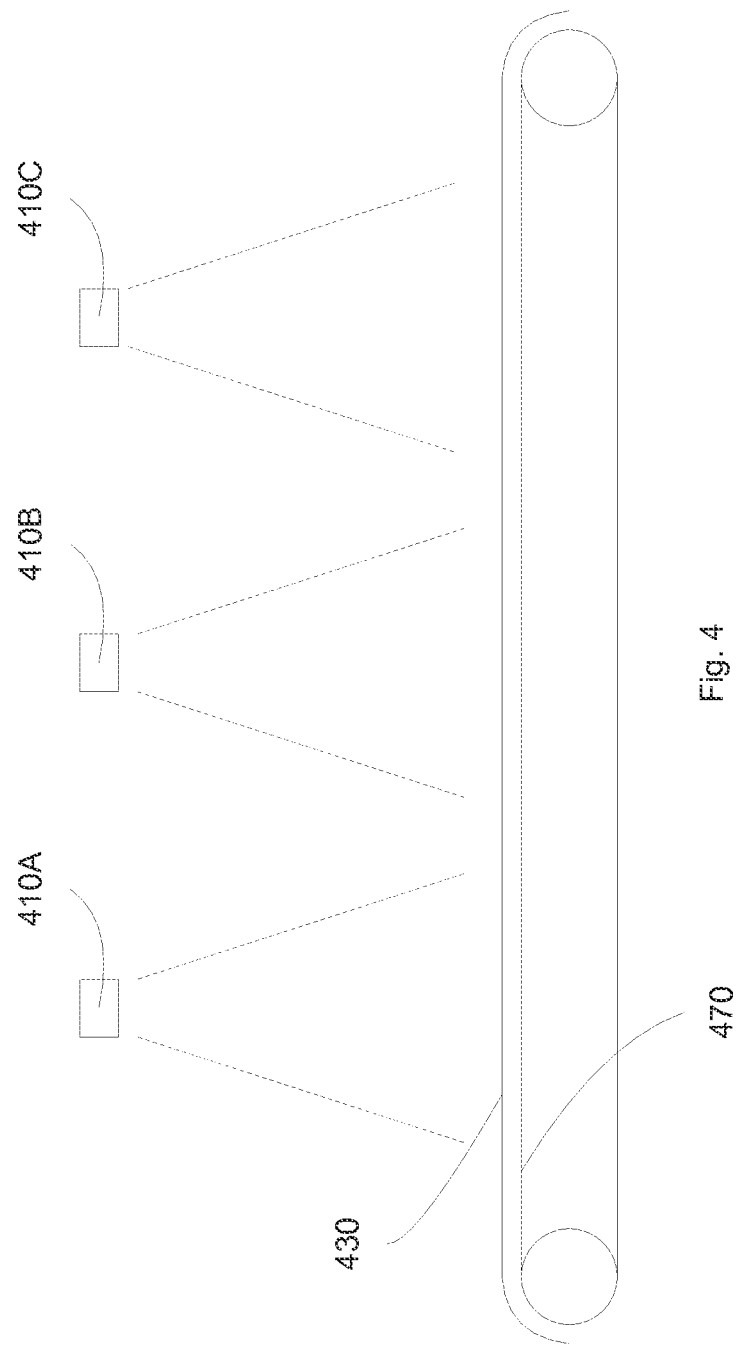

SILVER BASED CONDUCTIVE LAYER FOR FLEXIBLE ELECTRONICS

FIELD OF THE INVENTION

The present invention relates generally to transparent conductive films, and more particularly to such films deposited on flexible substrates.

BACKGROUND OF THE INVENTION

Transparent conductive films can provide both large area electrical conductivity and optical transparency in the visible range of the light spectrum. Potential applications for transparent conductive films include architectural glasses and flat panel displays (FPD).

Architectural glass commonly used in applications such as building glass windows and vehicle windows, typically offers high visible transmission and low emissivity. High visible transmission can allow more sunlight to pass through the windows, thus being desirable in many window applications. Low emissivity can block infrared (IR) radiation to reduce undesirable interior heating. Flat panel displays are used in various electronic devices. For example, flat panel displays can include liquid crystal displays (LCD), plasma displays, and organic light emitting diode displays (OLED). In a flat panel display, the substrates can be manufactured with transparent electrodes, to provide electrical interconnection.

Advances in flexible devices, either in display or lighting components, are driven by many aspects of the device, including the contact layer and electrodes. As a conductive and transparent material, ITO (Indium-Tin-Oxide), is the most commonly used material due its combination of electrical (high conductivity) and optical (high transparency) properties. However, ITO can be brittle, which can limit its use in applications which require the bending and shaping of substrates, which includes flexible displays and flexible touchscreens, and flexible OLEDs for lighting, as well as flexible OLEDs for displays.

Advanced flat panel displays, e.g., larger screen size and faster graphics, can require higher conductivity in transparent conductive films. Ultra thin silver layers can be much thinner than a typical transparent conductive film and still provide superior conductivity. Further, silver is ductile, which can enable the device to be bent. However, silver is not a very durable material, and if used as an ultra-thin layer, can result in a limited lifetime and durability.

Therefore, is it desirable to improve silver based conductive layers for flexible electronic applications.

SUMMARY OF THE DISCLOSURE

In some embodiments, the present invention discloses methods to form a transparent conductive stack for flexible substrates. The methods can include forming a doped silver or a silver alloy layer sandwiched between two layers of transparent conductive oxide layers.

In some embodiments, the present invention discloses a conductive stack that can be transparent and conductive, in addition to being ductile, and suitable for flexible applications. The conductive stack can include a doped silver or a silver alloy layer sandwiched between two layers of transparent conductive oxide. The doped silver or silver alloy layer can be thin, such as between 1.5 to 20 nm, or between 2 nm and 12 nm, or between 5 nm to 9 nm, and thus can be transparent. The doped silver or silver alloy can provide improved ductility properties, allowing the conductive stack to be bendable. The transparent conductive oxide layers can also be thin, such as between 10 nm and 100 nm. Since the thickness of the transparent conductive oxide layers of the conductive stack can be less than half of the thickness of conventional transparent conductive oxide layer, the conductive stack can have improved ductility properties.

In some embodiments, the doped silver or silver alloy layer includes a silver material doped with an element having low enthalpy of oxide formation, such as Ti, Pd, Cu, Cr, Mn, Zn, Ni, Sn, Ta, Pt, Bi, or Sb. The dopant thus can form oxides or hydroxides with moisture or oxygen in the environment, preventing oxidation of the silver. The dopant can form a single phase in the silver layer, with the concentration between 0.1 wt % to 10 wt %. In some embodiments, the doped silver can include a single dopant species. The silver alloy can include a binary alloy of silver with an element having low enthalpy of oxide formation. In some embodiments, the doped silver layer can include silver doped with an oxide dopant or a hydroxide dopant. The doped silver layer can include silver oxide doped with an oxide dopant or a hydroxide dopant.

In some embodiments, the present invention discloses flexible devices, including a conductive stack that is transparent, conductive and ductile.

BRIEF DESCRIPTION OF THE DRAWINGS

To facilitate understanding, identical reference numerals have been used, where possible, to designate identical elements that are common to the figures. The drawings are not to scale and the relative dimensions of various elements in the drawings are depicted schematically and not necessarily to scale.

The techniques of the present invention can readily be understood by considering the following detailed description in conjunction with the accompanying drawings, in which:

FIG. 3 illustrates an in-line deposition system according to some embodiments.

FIG. 4 illustrates a roll-to-roll deposition system according to some embodiments.

DETAILED DESCRIPTION OF THE DISCLOSURE

Figure 1:
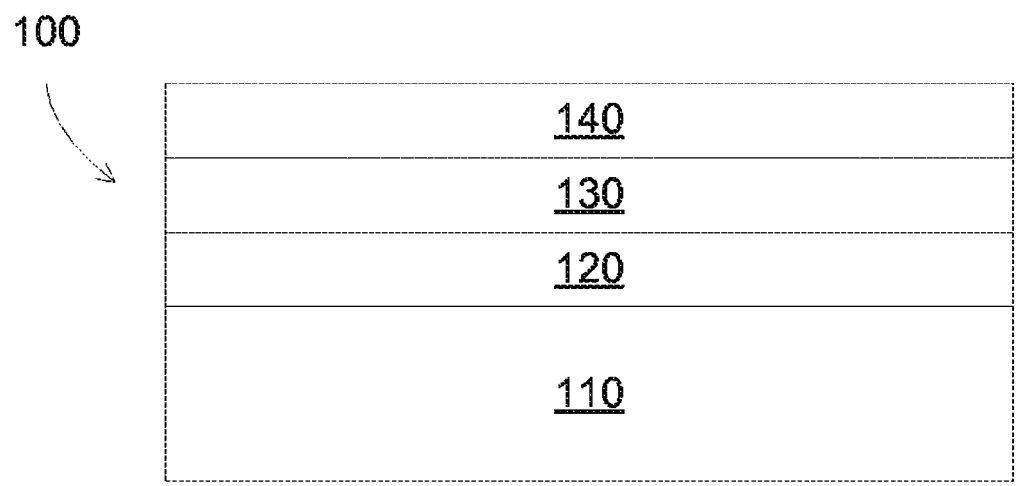
FIG. 1 illustrates a conducting stack according to some embodiments.

A detailed description of one or more embodiments is provided below along with accompanying figures. The detailed description is provided in connection with such embodiments, but is not limited to any particular example. The scope is limited only by the claims and numerous alternatives, modifications, and equivalents are encompassed.

Numerous specific details are set forth in the following description in order to provide a thorough understanding. These details are provided for the purpose of example and the described techniques may be practiced according to the claims without some or all of these specific details. For the purpose of clarity, technical material that is known in the technical fields related to the embodiments has not been described in detail to avoid unnecessarily obscuring the description.

In some embodiments, methods and apparatuses for making flexible coated panels are provided. The flexible coated panels can include coated layers formed on a flexible substrate, such as a conductive stack having a conductive material such as silver. To improve the durability of the conductive stack, for example, against oxidation from deposition of subsequent layers or from subsequent high temperature anneals, a doped silver layer or an alloy silver layer can be used, sandwiched between two layers of transparent conductive oxide layers such as indium tin oxide (ITO).

In some embodiments, methods and apparatuses for making flexible coated panels, which include depositing a first transparent conductive oxide layer, such as an ITO layer, followed by a doped silver layer or an alloy silver layer, followed by a second transparent conductive oxide layer, such as an ITO layer. The doped or alloyed silver layer can provide the conductivity, and the sandwiched transparent conductive oxide layers can protect the doped or alloyed silver layer, together with providing integration compatibility with other layers in the coated layers.

In some embodiments, the transparent conductive oxide layers can include any type of transparent conductive materials, such as ITO. Since the sandwiched transparent conductive oxide layers are thinner than a conventional transparent conductive oxide layer, e.g., their required thickness is for protection and not for electrical conductivity, minimum thickness can be used. The thickness of the transparent conductive oxide layers can be between 1 nm and 100 nm.

In some embodiments, the doped or alloyed silver layer can include a dopant having high oxygen affinity. The high oxygen affinity dopant can attract oxygen from the silver element, preventing oxidation of the doped or alloyed silver layer. In some embodiments, the doped or alloyed silver layer can include an alloy of silver with an element having high oxygen affinity. The oxygen affinity property can be characterized by enthalpy of oxide formation, e.g., the ability to form oxides or hydroxides with oxygen in the environment, such as moisture in the ambient or excited oxygen species in an oxygen plasma ambient. The thickness of the doped or alloyed silver layer can be between 1.5 nm and 20 nm, such as between 5 nm and 12 nm, or between 5 nm and 9 nm.

In some embodiments, the high oxygen affinity dopant (or element) can have high enthalpy of oxide formation, meaning the high oxygen affinity dopant or element can easily form oxide. In other words, the enthalpy of formation can be more negative, i.e., having a negative value that is high in magnitude. In some embodiments, the high oxygen affinity dopant (or element) can have enthalpy of oxide formation greater than about 1200 kJ/mol (in magnitude), greater than about 1000 kJ/mol (in magnitude), greater than about 800 kJ/mol (in magnitude), or greater than about 600 kJ/mol (in magnitude). In some embodiments, the high oxygen affinity dopant can include a metallic element, which has formation enthalpy of metal oxide to be in the top 30%, for example, in the top 10%, among all the metal oxides.

In some embodiments, the high oxygen affinity dopant can have a minor composition, such as the percentage of the high oxygen affinity dopant is less than 50 wt %. For example, the percentage of the high oxygen affinity dopant can be between 0.1 and 10%, such as between 0.25 and 5 wt %.

In some embodiments, additional requirements can be imposed on the dopants. For example, the dopants can be selected to form a single phase alloy with silver or have high solubility in silver, at least for the concentration used. The single phase alloy can have a homogeneous composition, and in a single phase alloy, most of the components of the alloy dissolve in each other. Further, the elements can be selected to have a low extinction coefficient in its metallic form and in its oxide form. The low extinction coefficient can reduce absorption of the incoming light, such as in the visible range. In some embodiments, the elements can have an extinction coefficient less than about 8, or can be less than about 5 or 6.

In some embodiments, the doped or alloyed silver can include a single dopant, for example, to form a single phase binary silver alloy. The use of single dopants can facilitate the development of the doped or alloyed silver since the variations and parameters used in the optimization of the material properties can be significantly reduced. In some embodiments, the single dopants can include metal elements of Ti, Pd, Cu, Cr, Mn, Zn, Ni, Sn, Ta, Pt, Bi, or Sb.

In some embodiments, the doped or alloyed silver can include one or more dopants. The use of multiple dopants can broaden the range of the possible properties of the doped or alloyed silver. In some embodiments, the multiple dopants can include elements of Ti, Cr, Mn, Zn, Ni, Sn, Ta, Pt, Bi, or Sb. In some embodiments, the doped or alloyed silver can include an oxide dopant or a hydroxide dopant.

The doped or alloyed silver layer can provide ductility to the conducting stack, e.g., the silver layer sandwiched between two transparent conductive oxide layers, which can allow the conducting stack to be bent or used in flexible substrate applications.

In some embodiments, methods and apparatuses for making panels which include a conducting stack including a doped or alloyed silver layer sandwiched between two layers of transparent conductive oxide layers. The silver layer can provide improved conductivity, allowing the transparent conductive oxide layers to be thin, avoiding potential crack or damage during flexible operations. The dopants in the doped or alloyed silver layer can provide improved ductility, further improving the flexibility. The panels can have improved overall quality of the conducting stack with respect to flexibility and reliability.

The coated panels having a conducting stack can include a flexible substrate, such as a transparent flexible substrate, including substrates made of organic polymers. The coated panels can be used in window applications such as vehicle and building windows, skylights, or glass doors, either in monolithic glazings or multiple glazings with or without a plastic interlayer or a gas-filled sealed interspace. The coated panels can be used in opto-electric devices or flat panel displays.

FIG. 1 illustrates a conducting stack according to some embodiments. A transparent conductive oxide layer 140 is disposed on a doped or alloyed silver layer 130, which is disposed on another transparent conductive oxide layer 120, which is disposed on a flexible substrate 110 to form a coated transparent panel 100, which has a conducting stack for electrical conduction with high ductility for flexible applications.

The layers, e.g., 120, 130, and 140, can be sputter deposited using different processes and equipment, for example, the targets can be sputtered under direct current (DC), pulsed DC, alternate current (AC), radio frequency (RF) or any other suitable conditions. In some embodiments, physical vapor deposition methods for depositing the layers with optimum conduction and ductility are disclosed. Alternatively, the layers can be deposited by other deposition processes, such as ion beam deposition, chemical vapor deposition, ion beam enhanced deposition, evaporation, and laser ablation deposition.

In some embodiments, the silver layer can be controlled to obtain high conductivity, for example, by optimizing the impurities in the silver layer. Pure silver layer can provide highest conductivity, as compared to silver oxide. However, silver can be easily oxidized, for example, during oxygen reactive sputtering process in the deposition of subsequent layers. In addition, the silver layer can have oxygen diffusion during a high temperature annealing process, or during long term use where the glass may be exposed to moisture or a reactive environment.

To maintain the conductivity of the silver layer, for example, against oxidation from deposition of subsequent layers or from subsequent high temperature anneals, a dopant can be introduced to the silver layer, forming a doped or an alloyed silver layer. The dopant elements can have a higher oxygen affinity, e.g., easily reacting with oxygen, than silver, and thus can protect the silver layer from oxidation by oxygen diffusion. The dopant elements can be selected to have high electrical conductivity, in both elemental and oxide forms, in order to reduce the degradation of electrical conduction if oxidized. In addition to the oxygen gettering property, there can be other desirable properties for the dopant elements. For example, the dopant elements can have high solubility in silver, for example, to form a single phase material.

In some embodiments, transparent conducting stacks, including a doped or alloyed silver layer sandwiched between two layers of transparent conducting oxide, and methods for forming the same, are disclosed. The transparent conducting stack can be formed on a flexible substrate to protect the devices fabricated on the flexible substrate from being damaged, for example, due to bending.

The transparent conducting stacks can include an alloy of silver with a dopant element having oxygen affinity higher than that of silver. The high oxygen affinity property of the dopant element can prevent oxidation of the silver element by attracting oxygen, for example, from the deposition of subsequent layers or from the subsequent high temperature processes. The dopant element and silver can form a doped or alloyed material, which can exhibit oxygen gettering property. The ratio of the dopant element to silver can be optimized, for example, the amount of the dopant element can be minimal, selected to achieve the oxidation protection property.

In some embodiments, doped or alloyed silver structures are disclosed. The silver structures can include a doping or alloying of silver with one or more dopant elements. The dopant element can include Ti, Pd, Cu, Cr, Mn, Zn, Ni, Sn, Ta, Pt, Bi, and Sb, which can have high oxygen affinity property. Dopant elements that can have high electrical conductivity in both elemental form and oxide form can be used.

In addition, the dopant elements can have high solubility in silver, resulting in a single phase mixing with silver, leading to minimal degradation of silver conductivity. The dopant elements can have low extinction coefficient in both metallic and metal oxide forms, thus can minimize degradation of light transmission or structural or optical changes due to a high temperature process.

In some embodiments, sputter deposition processes, which can be applied for a conducting stack deposited on a flexible substrate are disclosed. For example, the conducting stack can allow the flexible substrate to bend without being damaged, while maintaining high electrical conduction and visible light transmission.

In some embodiments, deposition processes, and coated articles fabricated from the process, using a layer having an alloy of a high oxygen affinity material and silver during the sputter deposition, for example, to achieve higher quality coated layers and coated panels, are disclosed.

In some embodiments, the alloy layer can be sputtered from an alloyed target, or co-sputtered from different elemental targets onto the same substrate. The process may be in pure Ar (which will deposit a pure metallic barrier layer), or may include oxygen to make the film slightly oxidized.

Figure 2A:
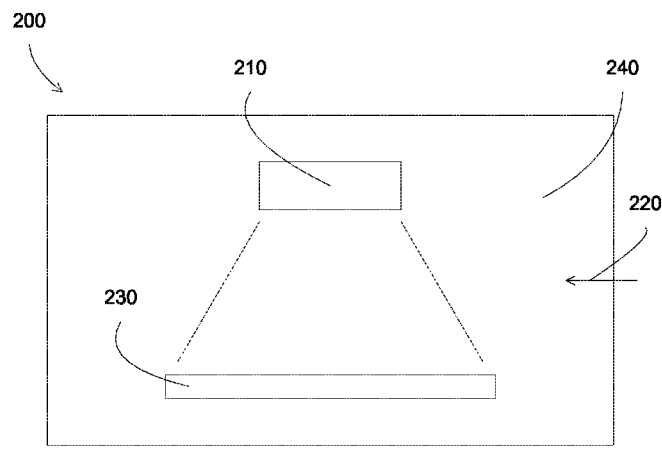
FIGS. 2A-2B illustrate physical vapor deposition (PVD) systems according to some embodiments.
Figure 2B:
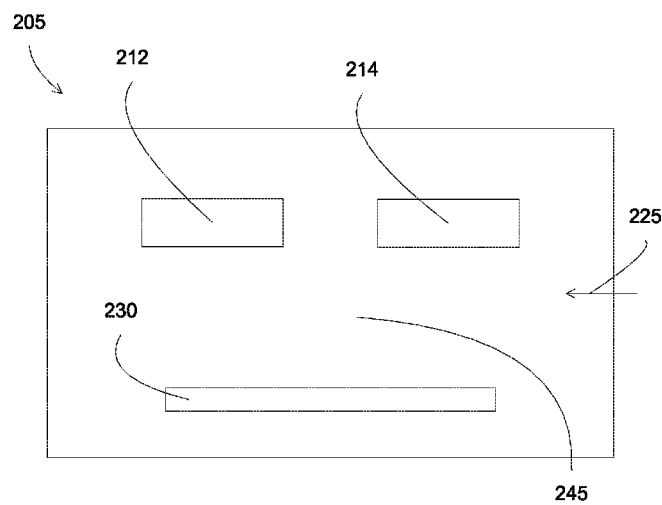

FIGS. 2A-2B illustrate physical vapor deposition (PVD) systems according to some embodiments. In FIG. 2A, a PVD system 200, also commonly called sputter system or sputter deposition system, includes a housing that defines, or encloses, a processing chamber 240, a substrate 230, a target assembly 210, and reactive species delivered from an outside source 220. During deposition, the target is bombarded with argon ions, which releases sputtered particles toward the substrate 230. The sputter system 200 can perform blanket deposition on the substrate 230, forming a deposited layer that cover the whole substrate, e.g., the area of the substrate that can be reached by the sputtered particles generated from the target assembly 210.

The materials used in the target 210 may, for example, include Ag, Ti, Pd, Cu, Cr, Mn, Zn, Ni, Sn, Ta, Pt, Bi, Sb, or any combination thereof (i.e., a single target may be made of an alloy of several metals). Additionally, the materials used in the targets may include oxygen in order to form the oxides of the metals described above. Additionally, although only one target assembly 210 is shown, additional target assemblies may be used. As such, different combinations of targets may be used to form, for example, the layers described above. For example, in some embodiments in which the doped silver material is palladium silver, the palladium and the silver may be provided by separate palladium and silver targets, or they may be provided by a single palladium-silver alloy target.

The sputter deposition system 200 can include other components, such as a substrate support for supporting the substrate. The substrate support can include a vacuum chuck, electrostatic chuck, or other known mechanisms. The substrate support can be capable of rotating around an axis thereof that is perpendicular to the surface of the substrate. In addition, the substrate support may move in a vertical direction or in a planar direction. It should be appreciated that the rotation and movement in the vertical direction or planar direction may be achieved through known drive mechanisms which include magnetic drives, linear drives, worm screws, lead screws, a differentially pumped rotary feed through drive, etc.

In some embodiments, the substrate support includes an electrode which is connected to a power supply, for example, to provide a RF or DC bias to the substrate, or to provide a plasma environment in the process housing 240. The target assembly 210 can include an electrode which is connected to a power supply to generate a plasma in the process housing. The target assembly 210 is preferably oriented towards the substrate 230.

The sputter deposition system 200 can also include a power supply coupled to the target electrode. The power supply provides power to the electrodes, causing material to be, at least in some embodiments, sputtered from the target. During sputtering, inert gases, such as argon or krypton, may be introduced into the processing chamber 240 through the gas inlet 220. In embodiments in which reactive sputtering is used, reactive gases may also be introduced, such as oxygen, which interact with particles ejected from the targets to form oxides on the substrate.

The sputter deposition system 200 can also include a control system (not shown) having, for example, a processor and a memory, which is in operable communication with the other components and configured to control the operation thereof in order to perform the methods described herein.

FIG. 2B shows a sputter system having co-sputtering targets according to some embodiments. A sputter deposition chamber 205 can include two targets 212 and 214 disposed in a plasma environment 245, containing reactive species delivered from an outside source 225. The targets 212 and 214 can include a dopant element of the doped or alloyed silver layer, e.g., Ti, Pd, Cu, Cr, Mn, Zn, Ni, Sn, Ta, Pt, Bi, or Sb and silver, together with optional reactive species of oxygen to deposit an alloy of oxide doped silver layer on substrate 230. This configuration serves as an example, and other sputter system configurations can be used, such as a single target having an alloy material.

In some embodiments, methods and apparatuses for making flexible panels, including forming a conducting stack having a doped or alloyed silver layer sandwiched by layers of transparent conductive oxide are disclosed. The panels can exhibit good electrical conductance, ductility and durability, for example, due to the doped or alloyed silver layer providing the conductivity and the thin transparent conductive oxide layers minimizing the potential damages due to bending.

In some embodiments, methods for making flexible panels in large area coaters are disclosed. A transport mechanism can be provided to move flexible substrates under one or more sputter targets, to deposit a doped silver layer sandwiched between two transparent conductive oxide layers, together with other layers such as a surface protection layer.

In some embodiments, in-line deposition systems, including a transport mechanism for moving substrates between deposition stations are disclosed.

FIG. 3 illustrates an in-line deposition system according to some embodiments. A transport mechanism 370, such as a conveyor belt or a plurality of rollers, can transfer substrate 330 between different sputter deposition stations. For example, the substrate can be positioned at station #1, having a target assembly 310A, then transferred to station #2, having target assembly 310B, and then transferred to station #3, having target assembly 310C. The station #1 having target 310A can be a transparent conducting oxide deposition station, sputtering a transparent conducting oxide layer. The station #2 having target 310B can be a doped or alloyed silver deposition station, sputtering a doped or alloyed layer of silver and an element having higher oxygen affinity material than silver. As shown, the station #2 includes a single target 310B. However, other configurations can be used, such as co-sputtering system utilizing two different targets. The station #3 having target 310C can be used to deposit another transparent conducting oxide layer.

In some embodiments, methods for roll-to-roll deposition of conducting stacks including a silver-based alloy thin film sandwiched between two layers of transparent conductive oxide thin films, on flexible plastic substrates are provided. The methods can be used to develop flexible display electrodes.

FIG. 4 illustrates a roll-to-roll deposition system according to some embodiments. A transport mechanism 470, such as a conveyor belt or a plurality of rollers, can transfer a roll of flexible substrate 430 between different sputter deposition stations. For example, the substrate can be positioned at station #1, having a target assembly 410A, then transferred to station #2, having target assembly 410B, and then transferred to station #3, having target assembly 410C. The station #1 having target 410A can be a transparent conducting oxide deposition station, sputtering a transparent conducting oxide layer. The station #2 having target 410B can be a doped or alloyed silver deposition station, sputtering a metallic doped or alloyed layer of silver and an element having higher oxygen affinity material than silver. As shown, the station #2 includes a single target 410B. However, other configurations can be used, such as co-sputtering system utilizing two different targets. The station #3 having target 410C can be used to deposit another transparent conducting oxide layer.

Figure 5:
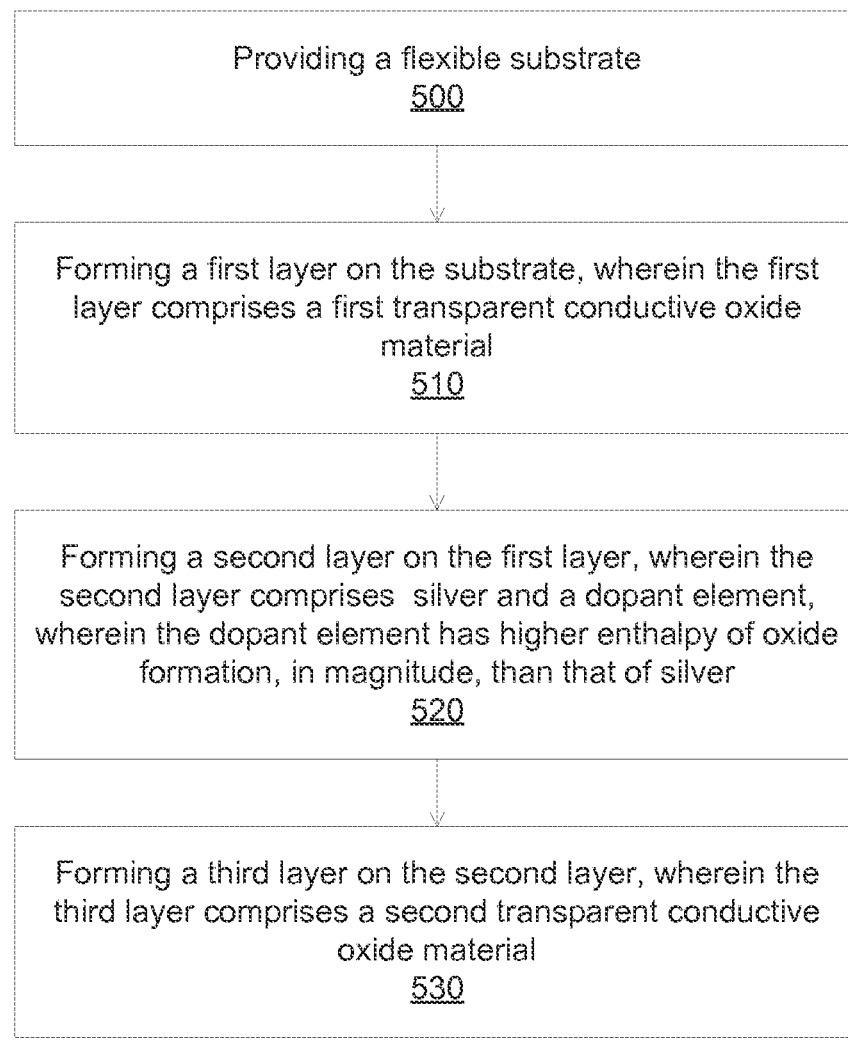
FIG. 5 illustrates a flow chart for sputtering coated layers according to some embodiments.

FIG. 5 illustrates a flow chart for sputtering coated layers according to some embodiments. After forming a first transparent conductive oxide layer on a flexible substrate, a doped or alloyed silver layer can be sputtered deposited on the first transparent conductive layer. Afterward, a second transparent conductive oxide layer can be sputtered deposited on the silver layer. The doped or alloyed silver layer can include an alloy of silver and a dopant element, wherein the dopant element can be selected to improve, or at least, not degrade, the flexibility of the conductive layer. For example, the dopant elements can be selected to have high solubility in silver, to have high electrical conductivity in both elemental forms and oxide forms. Further, the dopant elements can be selected to have high oxygen affinity, such as higher than that of silver. The dopant elements can have extinction coefficient less than 5 in both elemental and oxide forms.

In operation 500, a flexible substrate is provided. The substrate can be a transparent substrate, such as a polymer substrate. Other substrates can also be used. In operation 510, a first layer is formed on the substrate. The first layer can be operable as a first transparent conductive layer. The first layer can include a transparent conductive oxide material, such as ITO.

In operation 520, a second layer is formed on the first layer. The second layer can include a doped or alloyed silver material. The dopant elements can be selected to improve the flexibility of the silver layer. For example, the dopant elements can be selected to have high solubility in silver, to have high electrical conductivity in both elemental forms and oxide forms. The dopant concentration can be between 0.1 to 10 wt %, such as between 0.25 and 5 wt %. Further, the dopant elements can be selected to have high oxygen affinity, such as higher than that of silver. In some embodiments, the oxygen affinity property can be characterized by free energy or enthalpy of oxide formation.

In some embodiments, the dopant element can include materials having enthalpy of oxide formation greater than 1200 kJ/mol, greater than 1000 kJ/mol, greater than 800 kJ/mol, or greater than 600 kJ/mol in magnitude.

The dopant elements can have extinction coefficient less than 5 in both elemental and oxide forms. The thickness of the second layer can be between 1.5 nm and 20 nm, can be between 5 nm and 12 nm, or can be between 5 nm and 9 nm. The dopant elements can have high electrical conductivity, both in elemental form and oxide form.

In operation 530, a third layer is sputter deposited on the second layer. The third layer can be operable as a second transparent conductive layer. The third layer can include a transparent conductive oxide material, such as ITO. In some embodiments, additional layers can be formed on the flexible substrate, such as an adhesion layer or a protective layer.

Figure 6:
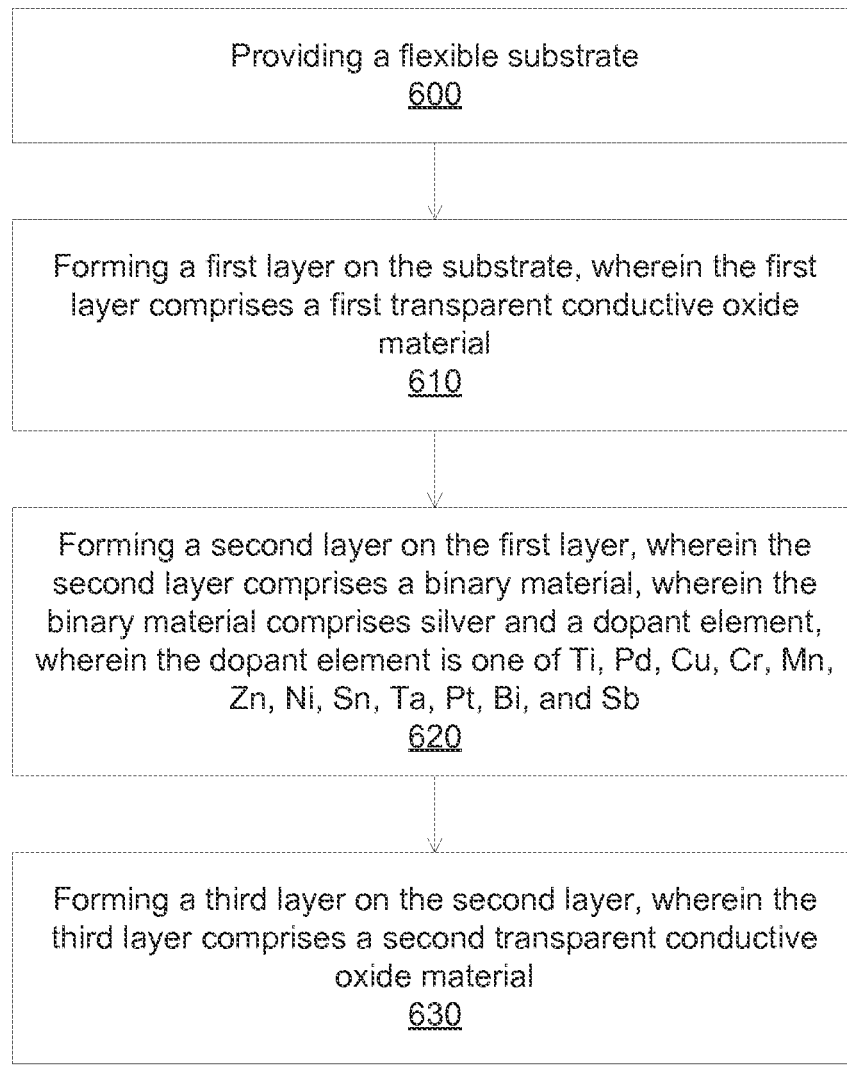
FIG. 6 illustrates a flow chart for sputtering coated layers according to some embodiments.

FIG. 6 illustrates a flow chart for sputtering coated layers according to some embodiments. A conducting stack including a doped or alloyed silver layer can be formed, sandwiched between two layers of transparent conductive oxide. The doped or alloyed silver layer can include an alloy of silver and a single dopant element, wherein the dopant element can be Ti, Pd, Cu, Cr, Mn, Zn, Ni, Sn, Ta, Pt, Bi, or Sb.

In operation 600, a flexible substrate is provided. The substrate can be a transparent substrate, such as a polymer substrate. Other substrates can also be used. In operation 610, a first layer is formed on the substrate. The first layer can be operable as a first transparent conductive layer. The first layer can include a transparent conductive oxide material, such as ITO.

In operation 620, a second layer is formed on the first layer. The second layer can include a binary doped or binary alloyed silver material. The dopant elements can be Ti, Pd, Cu, Cr, Mn, Zn, Ni, Sn, Ta, Pt, Bi, or Sb. The dopant concentration can be between 0.1 to 10 wt %, such as between 0.25 and 5 wt %. The thickness of the second layer can be between 1.5 nm and 20 nm, can be between 5 nm and 12 nm, or can be between 5 nm and 9 nm.

In operation 630, a third layer is sputter deposited on the second layer. The third layer can be operable as a second transparent conductive layer. The third layer can include a transparent conductive oxide material, such as ITO. In some embodiments, additional layers can be formed on the flexible substrate, such as an adhesion layer or a protective layer.

Figure 7:
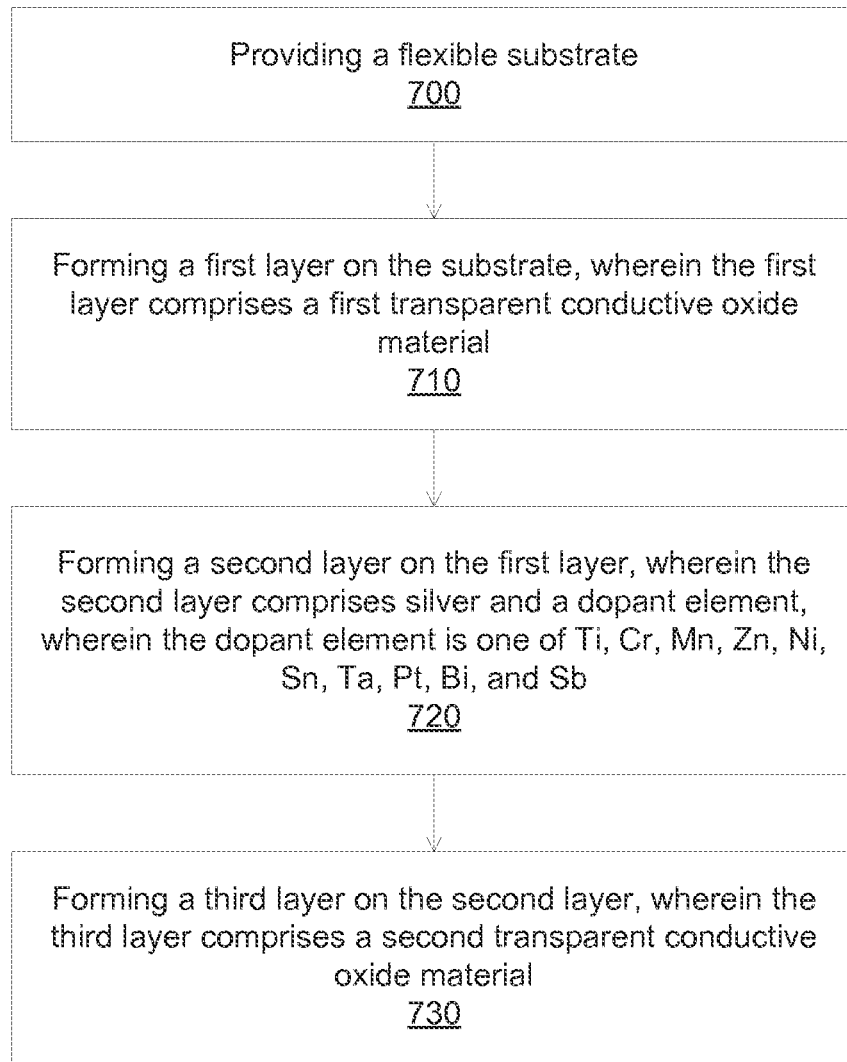
FIG. 7 illustrates a flow chart for sputtering coated layers according to some embodiments.

FIG. 7 illustrates a flow chart for sputtering coated layers according to some embodiments. A conducting stack including a doped or alloyed silver layer can be formed, sandwiching two layers of transparent conductive oxide. The doped or alloyed silver layer can include an alloy of silver and one or more dopant elements, wherein the dopant elements can be at least one of Ti, Cr, Mn, Zn, Ni, Sn, Ta, Pt, Bi, or Sb.

In operation 700, a flexible substrate is provided. The substrate can be a transparent substrate, such as a polymer substrate. Other substrates can also be used. In operation 710, a first layer is formed on the substrate. The first layer can be operable as a first transparent conductive layer. The first layer can include a transparent conductive oxide material, such as ITO.

In operation 720, a second layer is formed on the first layer. The second layer can include a doped or alloyed silver material. The dopant elements can be at least one of Ti, Cr, Mn, Zn, Ni, Sn, Ta, Pt, Bi, or Sb. The dopant concentration can be between 0.1 to 10 wt %, such as between 0.25 and 5 wt %. The thickness of the second layer can be between 1.5 nm and 20 nm, can be between 5 nm and 12 nm, or can be between 5 nm and 9 nm.

In operation 730, a third layer is sputter deposited on the second layer. The third layer can be operable as a second transparent conductive layer. The third layer can include a transparent conductive oxide material, such as ITO. In some embodiments, additional layers can be formed on the flexible substrate, such as an adhesion layer or a protective layer.

In some embodiments, the conducting stack including a doped or alloyed silver can exhibit better performance, for example, in chemical testing, compared to pure silver. In durability tests in basic chemical, the rate of doped silver degradation is reduced by more than 15× as compared to pure silver. The doped or alloyed silver layer can offer improved durability for the conducting stack, which can significantly improve the lifetime of the panels having the conducting stack disposed thereon. For example, the dopant elements can serve to preferentially react with moisture and oxygen to form oxides and hydroxides, leaving the silver intact. The doped or alloyed silver layer can also provide ductility to the conducting stack, which can allow the stack to be bent and used in flexible applications.

In some embodiments, methods for fabricating transparent conducting stack are provided. The conducting stack can include a silver-based alloy thin film sandwiched between two layers of transparent conductive oxide thin films. The conducting stack can be suitable for use as a transparent electrical conductor on flexible substrates for various optoelectronic device applications such as liquid crystal displays, flat panel displays, plasma displays, solar cells, organic light emitting diodes, and electrochromic or energy efficient windows. The thickness of the silver alloy film can be less than 20 nm. The silver alloys can have moderate to high electrical conductivity and reflectivity with reasonably good corrosion resistance. In addition, the composite layers can have improved ductility, preventing cracking of the layers upon bending.

In some embodiments, the flexible substrate can include a polymer film that can support the conducting stack. The flexible substrate can have sufficient thickness and mechanical integrity. For example, the thickness of the flexible substrate can be between 100 to 500 μm.

In some embodiments, the conducting stack can be used in a flexible flat panel display, such as a liquid crystal display (LCD) or organic light emitting diode (OLED).

Generally, LCD can include two sheets of polarizing material sandwiching a liquid crystal solution. The liquid crystal can be used as optical switches, changing its opacity (or transparency) based on an applied electric field. Transparent electrodes, such as the conducting stack disclosed herein can be used to provide the switching elements.

Figure 8:
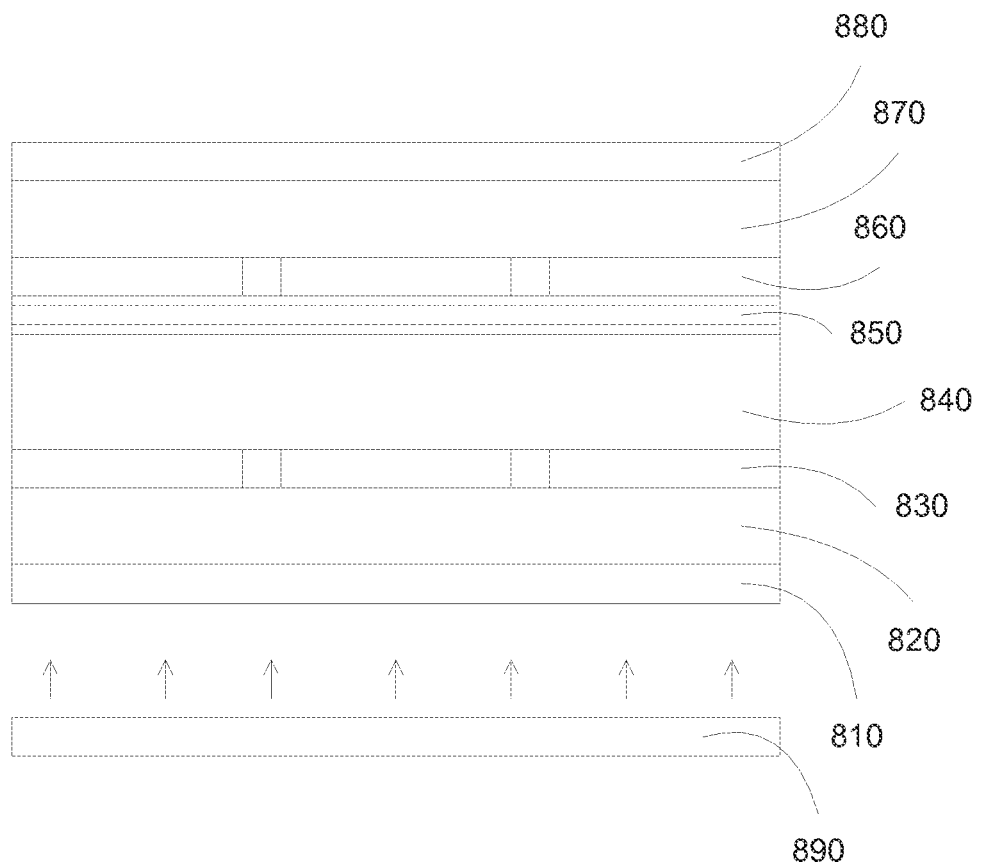
FIG. 8 illustrates an LCD schematic according to some embodiments.

FIG. 8 illustrates an LCD schematic according to some embodiments. Two polarizers 810 and 880 can be attached to substrates 820 and 870, respectively to control the polarization of light passing through the LCD panel. The polarizers 810 and 880 can sandwich a liquid crystal layer 840, which can exhibit different light-reflecting characteristics according to its state. The liquid crystal layer 840 can change its state due to an electric field generated by electrode layers 830 and 850. The electrode layer 830 can include a thin film transistor array, driven by signal circuit to applying voltage to selective pixels. The electrode layer 850 can include a conducting stack, including a doped or alloyed silver layer sandwiched between two layers of transparent conducting oxide. A color filter layer 860 can be used to change color of each pixel. A light source 890 can be used to provide a backlight.

Figure 9:
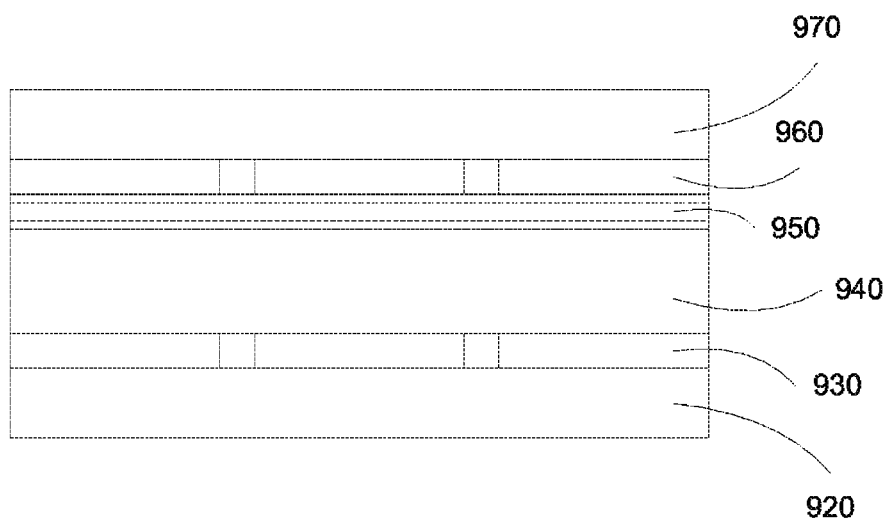
FIG. 9 illustrates an OLED schematic according to some embodiments.

FIG. 9 illustrates an OLED schematic according to some embodiments. The OLED panel can include an organic or polymer light emitting layer 940, which can be made to electroluminesce, e.g., emitting light, by applying a voltage across the layer. The voltage can be applied to electrode layers 930 and 950, which sandwich the light emitting layer 940. The electrode layer 930 can include a thin film transistor array, driven by signal circuit to applying voltage to selective pixels. The electrode layer 950 can include a conducting stack, including a doped or alloyed silver layer sandwiched between two layers of transparent conductive oxide. A color filter layer 960 can be used to change color of each pixel.

The conducting stack including a doped or alloyed silver layer sandwiched by two layers of transparent conductive oxide can provide improvement to the flexible flat panel displays, for example, by improving the ductility of the conducting stack. The conducting stack can have much thinner thickness for similar conductivity as compared to transparent conductive oxide layers. The conducting stack can be smoother, and can be more flexible as compared to transparent conductive oxide layers. The conducting stack can be deposited at lower temperatures, allowing the use of polymer flexible substrates. Further, the conducting stack can improve the yield of the display fabrication process, such as improving the deposition rate of the conducting stack as compared to a single layer of transparent conductive oxide, e.g., ITO.

In some embodiments, the conducting stack can serve as a replacement for transparent conductive oxide, especially for flexible substrates. For example, the conducting stack can be 10 to 25× thinner than ITO, and deposited at a deposition rate 10 to 100× faster.

In some embodiments, the conducting stack can be used in flexible solar panels. In a solar panel, sunlight can reach the p-n junction of the solar panel to generate electron and hole pairs. The electron and hole pairs move to the top and bottom electrodes to generate the current, which can be used for powering devices.

Figure 10:
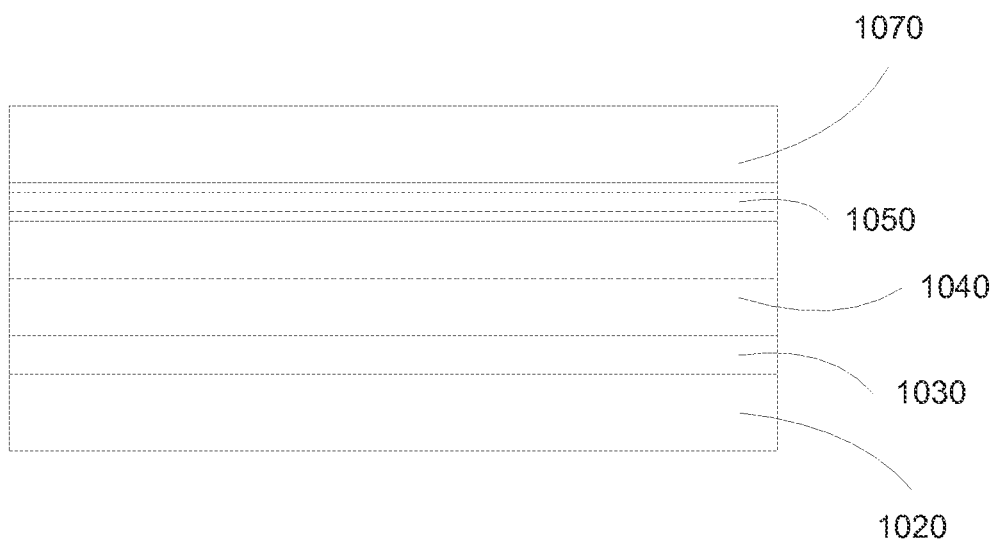
FIG. 10 illustrates a solar panel schematic according to some embodiments.

FIG. 10 illustrates a solar panel schematic according to some embodiments. The solar panel can include an p-n junction layer 1040, which is sandwiched by a top electrode 1050 and a bottom electrode 1030. The bottom electrode can be disposed on a flexible substrate 1020. The top electrode 1050 can be protected by a protective layer 1070. The top electrode 1050 can include a conducting stack, including a doped or alloyed silver layer sandwiched between two layers of transparent conducting oxide.

Figure 11:
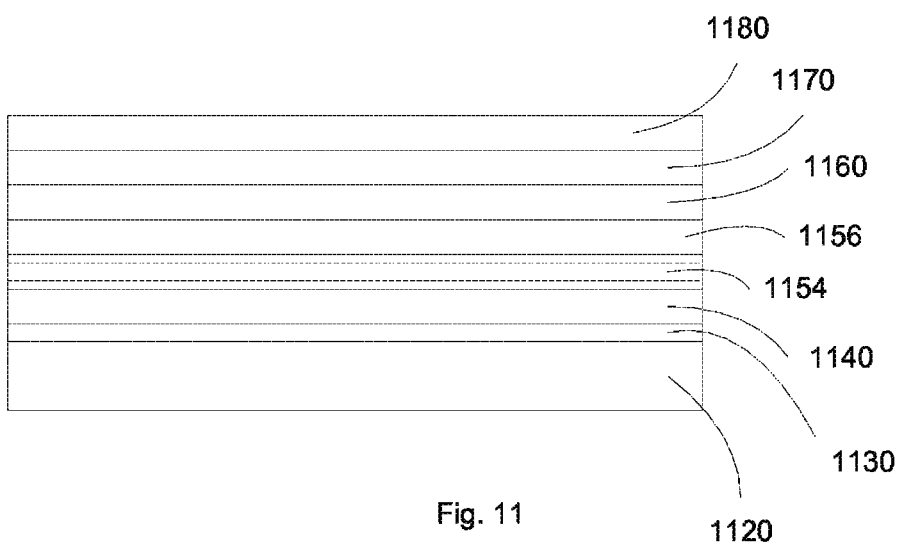
FIG. 11 illustrates a low emissivity transparent flexible panel according to some embodiments.

In some embodiments, the conducting stack can serve as a reflective layer for flexible low emissivity panels. FIG. 11 illustrates a low emissivity transparent flexible panel according to some embodiments. The low emissivity transparent panel can include a flexible substrate 1120 and a low emissivity (low-e) stack formed over the flexible substrate 1120. The flexible substrate 1120 in some embodiments is made of plastic or polycarbonate, and has a thickness of, for example, between 1 and 10 millimeters (mm). The substrate 1120 may be square or rectangular and about 0.5-2 meters (m) across. In some embodiments, the substrate 1120 may be formed in a roll configuration.

The low-e stack can include a lower protective layer 1130, a lower oxide layer 1140, a reflective layer 1154, a barrier layer 1156, an upper oxide layer 1160, an optical filler layer 1170, and an upper protective layer 1180. Some layers can be optional, and other layers can be added, such as interface layers or adhesion layers. The reflective layer 1154 can include a conducting stack, including a doped or alloyed silver layer sandwiched between two layers of transparent conducting oxide. Exemplary details as to the functionality provided by each of the layers 1130-1180 are provided below.

The various layers in the low-e stack may be formed sequentially (i.e., from bottom to top) on the substrate 1120 using a physical vapor deposition (PVD) and/or reactive (or plasma enhanced) sputtering processing tool. In some embodiments, the low-e stack is formed over the entire substrate 1120. However, in other embodiments, the low-e stack may only be formed on isolated portions of the substrate 1120.

The lower protective layer 1130 is formed on the upper surface of the substrate 1120. The lower protective layer 1130 can protect the other layers in the stack from diffusion from the substrate 1120 or to improve the haze reduction properties. The lower oxide layer 1140 is formed on the lower protective layer 1130 and over the substrate 1120. The lower oxide layer can serve as an antireflective layer.

The reflective layer 1154 is formed on the lower oxide layer 1140. In general, the IR reflective film includes a good electrical conductor, blocking the passage of thermal energy.

Formed on the reflective layer 1154 is a barrier layer 1156, which can protect the reflective layer 1154. Formed on the barrier layer 1156 is an upper oxide layer 1160, which can function as an antireflective film stack, including a single layer or multiple layers for different functional purposes. The antireflective layer 1160 serves to reduce the reflection of visible light, selected based on transmittance, index of refraction, adherence, chemical durability, and thermal stability. The optical filler layer 1170 can be used to provide a proper thickness to the low-e stack, for example, to provide an antireflective property. An upper protective layer 1180 can be used for protecting the total film stack, for example, to protect the panel from physical or chemical abrasion.

Although the foregoing examples have been described in some detail for purposes of clarity of understanding, the invention is not limited to the details provided. There are many alternative ways of implementing the invention. The disclosed examples are illustrative and not restrictive.

What is claimed is:

1. A method for making a coated article, the method comprising:
   providing a substrate,
      wherein the substrate comprises a transparent and flexible material;
   forming a first layer over the substrate,
      wherein the first layer comprises a first transparent conductive oxide material;
   forming a second layer over the first layer,
      wherein the second layer comprises a binary alloy, the binary alloy consisting of silver and Bi; and
   forming a third layer over the second layer,
      wherein the third layer comprises a second transparent conductive oxide material.

2. A method as in claim 1 wherein the first transparent conductive oxide material or the second transparent conductive oxide material comprises indium tin oxide.

3. A method as in claim 1 wherein the concentration of Bi in the binary alloy is between 0.1 wt % and 10 wt %.

4. A method as in claim 1 wherein the concentration of Bi in the binary alloy is between 0.25 wt % and 5 wt %.

5. A method as in claim 1 wherein the thickness of the second layer is between 1.5 nm to 20 nm.

6. A method as in claim 1 wherein the thickness of the second layer is between 5 nm to 12 nm.

7. A method as in claim 1 wherein the second layer consists of the alloy.

8. A method for making a coated article, the method comprising:
   providing a substrate,
      wherein the substrate comprises a transparent and flexible material;
   forming a first layer over the substrate,
      wherein the first layer comprises indium tin oxide;
   forming a second layer over the first layer,
      wherein the second layer comprises a binary alloy, the binary alloy consisting of silver and Bi; and
   forming a third layer over the second layer,
      wherein the third layer comprises indium tin oxide.

9. A method as in claim 8 wherein the concentration of Bi in the binary alloy is between 0.25 wt % and 5 wt %.

10. A method as in claim 8 wherein the thickness of the second layer is between 5 nm to 9 nm.

11. A method as in claim 8 wherein the second layer consists of the binary alloy.

* * * * *